United States Patent
Ryu et al.

(10) Patent No.: US 10,565,419 B2
(45) Date of Patent: Feb. 18, 2020

(54) THIN FLAT TYPE OPTICAL IMAGING SENSOR AND FLAT PANEL DISPLAY EMBEDDING THE SAME

(71) Applicant: LG Display Co., Ltd., Seoul (KR)

(72) Inventors: Seungman Ryu, Paju-si (KR); Ara Yoon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 150 days.

(21) Appl. No.: 15/826,437

(22) Filed: Nov. 29, 2017

(65) Prior Publication Data
US 2018/0150674 A1    May 31, 2018

(30) Foreign Application Priority Data
Nov. 30, 2016 (KR) .................. 10-2016-0162214

(51) Int. Cl.
*G06K 9/00* (2006.01)
*H01L 27/146* (2006.01)
*F21V 8/00* (2006.01)
*G01J 1/42* (2006.01)

(52) U.S. Cl.
CPC ........ *G06K 9/00013* (2013.01); *G02B 6/0015* (2013.01); *G02B 6/0035* (2013.01); *G02B 6/0091* (2013.01); *H01L 27/14678* (2013.01); *G01J 1/42* (2013.01)

(58) Field of Classification Search
CPC ............. G06K 9/00013; G06K 9/0004; G02B 6/0055; G02B 6/0018; G02B 6/0091; G02B 6/0035; G02B 6/0015; H01L 27/14678; G01J 1/42
See application file for complete search history.

(56) References Cited

U.S. PATENT DOCUMENTS

| | | | |
|---|---|---|---|
| 2004/0062502 A1* | 4/2004 | Levola | G02B 5/1866 385/129 |
| 2004/0246743 A1* | 12/2004 | Lee | G02B 6/0036 362/561 |
| 2004/0252867 A1* | 12/2004 | Lan | G06K 9/0004 382/124 |
| 2009/0154198 A1* | 6/2009 | Lee | G02B 6/0081 362/624 |
| 2014/0376258 A1* | 12/2014 | Wu | G02B 6/0055 362/607 |
| 2015/0212250 A1* | 7/2015 | Tai | G02B 6/0031 362/609 |
| 2015/0219834 A1* | 8/2015 | Nichol | G02B 6/0076 362/607 |
| 2016/0247010 A1* | 8/2016 | Huang | G02B 5/20 |
| 2017/0262686 A1* | 9/2017 | Gao | G06K 9/0004 |
| 2018/0357460 A1* | 12/2018 | Smith | G06K 9/4661 |

* cited by examiner

*Primary Examiner* — John B Strege
(74) *Attorney, Agent, or Firm* — Polsinelli PC

(57) ABSTRACT

The present disclosure relates to a flat panel display embedding an optical imaging sensor such as a fingerprint image sensor. The present disclosure suggests a flat panel type optical image sensor comprising: a cover plate having a sensing area; a light incident film disposed at a side under the cover plate; a light radiating film disposed under the cover plate corresponding to the sensing area; a low refractive layer under the light incident film and the light radiating film; a light source disposed under the light incident film; and a light sensor disposed under the light incident film.

27 Claims, 4 Drawing Sheets

THIN FLAT TYPE OPTICAL IMAGING SENSOR AND FLAT PANEL DISPLAY EMBEDDING THE SAME

CROSS-REFERENCE TO RELATED APPLICATION

This application claims the benefit of Korea Patent Application No. 10-2016-0162214 filed on Nov. 30, 2016, which is incorporated herein by reference in its entirety for all purposes as if fully set forth herein.

BACKGROUND

Field of the Disclosure

The present disclosure relates to a display device, and more particularly, to a flat panel display embedding an optical imaging sensor such as a fingerprint image sensor. Especially, the present disclosure relates to a thin flat type optical image sensor and a flat panel display embedding the same optical imaging sensor.

Description of the Background

Various computer based systems including a notebook computer, a tablet personal computer (or, PC), the smart phone, personal digital assistants, automated teller machines (ATM) and/or search information system have been developed. As these devices use and store the various personal information as well as the business information and the confidential information, it is required to strengthen the securities for preventing these important data from being leaked.

To do so, one method has been suggested for strengthening the security using an image sensor recognizing the authorized user's biological information. For example, the fingerprint sensor is generally used for enhancing the security when registering and authenticating are performed. The fingerprint sensor is for sensing the fingerprint of user. The fingerprint sensor may be categorized into the optical fingerprint sensor and the capacitive fingerprint sensor.

The optical fingerprint sensor uses a light source such as a light emitting diode (or LED) to irradiate light and detects the light reflected by ridges of the fingerprint using a CMOS (or, complementary metal oxide semiconductor) image sensor. As the optical fingerprint sensor scans the fingerprint using the LED light, it is required that the sensor is equipped with an additional device for performing the scan process. There is a limitation to increasing the size of the object for scanning the image. Therefore, there are limitations to applying the optical fingerprint sensor to various applications such as combining with the display devices.

For conventional optical fingerprint sensors, known are a Korean patent 10-060817 registered on Jun. 26, 2006 of which title is "A display apparatus having fingerprint identification sensor" and a Korean patent application 10-2016-0043216 published on Apr. 21, 2016 of which title is "Display device including fingerprinting device".

The above mentioned optical fingerprint sensors use the display area as the touch area for inputting the user's selection and the sensing area for sensing the fingerprint. However, this optical fingerprint sensor uses the diffused (or diverged) light having very low directivity. Therefore, there is a limitation to recognizing the exact fingerprint pattern. When using the collimated light such as the infrared laser having high directivity, it is difficult to generating the sensing light as covering the wider area. Therefore, the fingerprint sensing area is restricted in small area. In order to radiate the collimated light over the wider scan area, specific scanning structure is required, so that this system is not suitable for portable or personal display apparatus.

Therefore, for portable devices embedding the fingerprint sensor, the capacitive fingerprint sensor is mainly used. However, the capacitive fingerprint sensor also has many problems.

The capacitive fingerprint sensor detects the difference of the electricity between the ridges and the valleys of the fingerprint contacting on the fingerprint sensor. For conventional capacitive fingerprint sensors, known is a US patent application 2013/0307818 published on Nov. 21, 2013 of which title is "Capacitive Sensor Packaging".

The above mentioned capacitive fingerprint sensor is an assembly type sensor embedding with a specific push button. It has a capacitive plate and a silicon wafer having a circuit for detecting the capacitive difference between the ridges and valleys of the fingerprint. Generally, as the sizes of the ridges and valleys of the fingerprint are very tiny, about 300~500s μm (micrometer), the capacitive fingerprint sensor needs a high resolution sensor array and an integrated chip (or IC) for processing the fingerprint detection. To do so, the silicon wafer should include a sensor array and an IC on one substrate.

However, when the high resolution sensor array and the IC are formed on the same silicon wafer, an assembly structure is required for joining the push button with the fingerprint sensor. Therefore, the structure becomes very complex and further the non-display area (or bezel area) is increased. In some cases, the push button (i.e., the home key of the smart phone) overlaps the fingerprint sensor, so that the thickness of the whole device becomes too thick. Further, the sensing area for the fingerprint is dependent on the size of the push button.

To solve above mentioned problems and limitations, some technologies have been suggested in which the touch sensor area is used as for sensing the fingerprint. For example, known are a U.S. Pat. No. 8,564,314 registered on Oct. 22, 2013 of which title is "Capacitive touch sensor for identifying a fingerprint", and a Korean patent 10-1432988 registered on Aug. 18, 2014 of which title is "A capacitive touch screen for integrated of fingerprint recognition".

In general cases of the personal portable devices such as the smart phones, an additional transparent film is attached for protecting the display glass panel. When the above mentioned technologies are applied to the personal portable devices, as attaching the protective film thereon, the precise performance for sensing or recognizing the fingerprint can be substantially degraded. In general, even though the protective film is attached, the touch function may be properly operated. However, the detection capability for the difference of the capacitive storage amount for sensing the fingerprint can be deteriorated by the protective film even though its thickness is very thin.

For a display embedding the capacitive fingerprint sensor, generally a protective film or a hardening glass may be further attached on the cover glass of the display. In that case, the recognition capability can be deteriorated. That is, the total thickness of the cover glass may affect the sensitivity of the capacitive fingerprint sensor. In the interim, the diffused light used in the sensing light source may affect the sensitivity of the optical fingerprint sensor. When using the collimated light for enhancing the sensitivity of the optical fingerprint sensor, the bulky and/or complex optical devices are required so that it is difficult to apply to a display for personal mobile device.

SUMMARY

In order to overcome the above mentioned drawbacks, the purpose of the present disclosure is to suggest a flat panel display embedding an ultra-thin optical image sensor (or an optical image recognition apparatus). Another purpose of the present disclosure is to suggest a flat panel display having an optical image sensor in which most of all or whole surface of the display panel would be used for the sensing area. Still another purpose of the present disclosure is to suggest a flat panel display embedding an optical image sensor in which a directional light is used as a sensing light covering large surface. Yet another purpose of the present disclosure is to suggest a flat panel display embedding an ultra-thin and large area optical image sensor of which resolution and sensitivity are very high and/or superior.

In order to accomplish the above purpose, the present disclosure suggests a flat panel type optical image sensor comprising: a cover plate having a sensing area; a light incident film disposed at a side under the cover plate; a light radiating film disposed under the cover plate corresponding to the sensing area; a low refractive layer under the light incident film and the light radiating film; a light source disposed under the light incident film; and a light sensor disposed under the light incident film.

In another aspect of the present disclosure, a portable electronic device including a display panel with an embedded image sensor comprises a display area displaying an image on the display panel; a low refractive layer on the display panel and refracting incident light; a cover plate having a sensing area and receiving the incident light; a light source providing the cover plate with the incident light through the low refractive layer; a light incident film receiving the incident light and expanding the received incident light corresponding to an area for the cover plate; a light radiating film directing the expanded incident light to an object to detect an image of the object and corresponding to the sensing area of the cover plate; and a light sensor receiving the image detected light traveling through the cover plate and the low refractive layer, wherein the expanded incident light propagates with repeating an internal total reflection in the cover plate without substantially losing an amount of the incident light.

In one aspect, the light source and the light sensor are disposed as facing the light incident film and being near to a center portion of the side.

In one aspect, the light source is disposed at a first end portion of the side as facing the light incident film; and the light sensor is disposed at a second end portion of the side as facing the light incident film, the second end portion being apart from the first end portion.

In one aspect, the light source provides an incident light in a first normal direction to a surface of the light incident film; the light incident film converts the incident light into a propagating light having an incident angle satisfying an internal total reflection condition in the cover plate, and provides the propagating light into the cover plate; and the radiating film converts the propagating light into a radiating light provided in a second normal direction to a surface of the cover plate.

In one aspect, the sensing area provides a reflecting light reflected by an object contacting on the cover plate to the light radiating film in the second normal direction; the light radiating film converts a reverse propagating light having the incident angle, and provides the reverse propagating light to the light incident film; and the light incident film coverts the reverse propagating light into a sensing light provided to the light sensor in the first normal direction.

In one aspect, the incident angle is larger than an internal total reflection critical angle within a space between an upper surface of the cover plate and an upper surface of the low refractive layer.

In addition, the present disclosure suggests a flat panel display embedding an image sensor comprises: a cover plate having a sensing area; a light incident film disposed at a side under the cover plate; a light radiating film disposed under the cover plate corresponding to the sensing area; a low refractive layer under the light incident film and the light radiating film; a light source disposed under the light incident film; a light sensor disposed under the light incident film; and a display panel disposed under the cover plate with the low refractive layer there-between, and having a display area and a non-display area.

The present disclosure suggests a flat panel display embedding an optical image sensor that has a high resolution recognizing ability or sensitivity by providing the direction-ized light (or 'oriented') as the sensing light. Comparing with the diffused light used in the conventional art for the fingerprint sensor, because that the directionized light according to the present disclosure are used for sensing the image without any loss of light so that the present disclosure has the merits of the higher resolution and the superior sensitivity. The present disclosure suggests a flat panel display embedding a large area optical image sensor in which a collimated infrared laser beam is expanded over a large area corresponding to the display panel for the sensing light using a holography technology. The present disclosure suggests a flat panel display having an ultra-thin optical image sensor in which a directional light is provided on the display surface within a thin thickness. Further, according to the present disclosure, the protective substrate disposed on the topmost surface is used as the cover substrate of the direction optical substrate. Using a holographic film, the collimated light is provided as covering the large area corresponding to the display surface so that the present disclosure suggests an ultra-thin direction optical substrate. When joining the optical image sensor to the display device, the whole thickness of the display device is not thicker. As the image sensing area may be set freely within the display area of the display device, the flat panel display embedding an optical image sensor according to the present disclosure may be applied various applications.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1A:
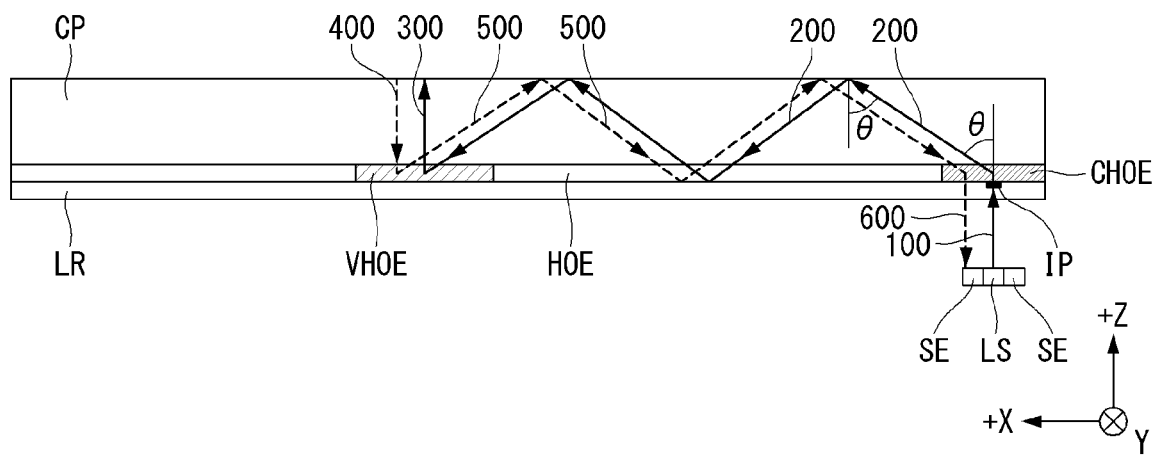
FIGS. 1A and 1B are drawings illustrating a structure of a directional optical unit applied for a flat panel display embedding an optical image sensor according to an aspect of the present disclosure.

Referring to attached figures, we will explain various aspects of the present disclosure. Like reference numerals designate like elements throughout the detailed description. However, the present disclosure is not restricted by these aspects but can be applied to various changes or modifications without changing the technical spirit. In the following aspects, the names of the elements are selected by considering the easiness for explanation so that they may be different from actual names.

Figure 1B:
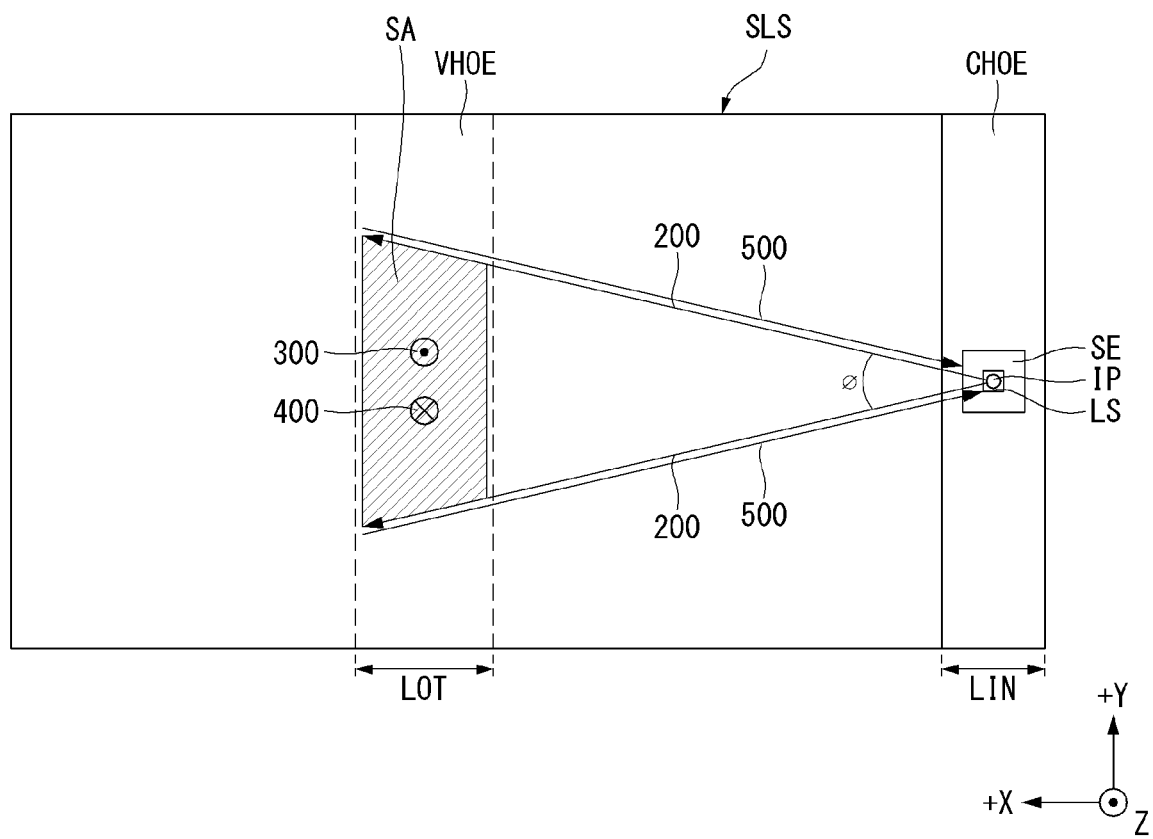

Hereinafter, with reference to FIGS. 1A and 1B, an aspect of the present disclosure will be described. FIGS. 1A and 1B are drawings illustrating a structure of a directional optical unit applied for a flat panel display embedding an optical image sensor according to an aspect of the present disclosure. More specifically, FIG. 1A is a side view on the XZ plane and FIG. 1B is a plan view on the XY plane.

Referring to FIGS. 1A and 1B, a directional optical unit according to an aspect comprises a directional optical substrate SLS, a light source LS and a light sensor (or photo sensor) SE. The directional optical substrate SLS includes a cover plate CP, a light radiating film VHOE, a light incident film CHOE and a low refractive layer LR. The cover plate CP may have a rectangular plate shape having a length, a width and a thickness. In FIGS. 1A and 1B, the length is oriented along the X-axis, the width goes along the Y-axis and the thickness runs along the Z-axis.

The directional optical unit is an optical device for providing collimated light expanded covering a large area corresponding to a surface of the display. Therefore, light source LS may need to provide a collimated light.

On the bottom surface of the cover plate CP, the light radiating film VHOE and the light incident film CHOE is attached. The light radiating film VHOE is an optical element for providing the radiating light 300. The light radiating film VHOE may be disposed to correspond to the area for detecting and/or sensing the image. For example, the light radiating film VHOE may be disposed to correspond to the image sensing area defined at a center portion of the cover plate CP or a portion slightly shifted from the center of the cover plate CP.

The light incident film CHOE is an optical element for converting the collimated light provided from the light source into the light expanded over the area of the cover plate CP. The light incident film CHOE may be disposed outside the light radiating film VHOE. Specifically, the light incident film CHOE may be disposed to face the light source LS.

The light radiating film VHOE and the light incident film CHOE may be disposed on the same plane level. Considering the manufacturing process, the light radiating film VHOE and the light incident film CHOE may be formed to be separated from each other, on the same film. The light radiating film VHOE and the light incident film CHOE may be the optical elements having the holographic patterns. In this case, after disposing the master film for the light radiating film VHOE and the master film for the light incident film CHOE at predetermined position, respectively, these two holographic patterns may be copied on one holographic recording film, at the same time.

Under the bottom surface of the light radiating film VHOE and the light incident film CHOE, a low refractive layer LR may be disposed. The low refractive layer LR may have a refractive index lower than that of the cover plate CP and the light radiating film VHOE. For example, the cover plate CP may be formed of a transparent reinforced glass having a refractive index of 1.5. The light radiating film VHOE and the light incident film CHOE may be a transparent holographic recording film and may have a refractive index the same as or slightly larger than that of the cover plated CP. In the present disclosure, the refractive index of the light radiating film VHOE and the light incident film CHOE are the same as that of the cover plate CP. A refractive index of the low refractive layer LR is similar to the refractive index of the scanning objects. For example, when applying to the fingerprint sensor, the low refractive layer LR may have the refractive index of 1.4 similar to the refractive index of human skin, 1.39.

At the space under the light incident film CHOE, the light source LS may be disposed to face the light incident film CHOE. The light source LS may provide a highly collimated light such as LASER beams. Specifically, when applying to the system in which the fingerprint sensor is embedded into a portable display, the light source LS may provide infrared laser beams which cannot be recognized by human eyes.

The collimated light from the light source LS, as an incident light 100, having a predetermined cross-sectional area is provided to a light incident point IP defined on the light incident film CHOE. The incident light 100 may enter into the normal direction with respect to the surface of the incident point IP. However, it is not restricted, in other case, the incident light 100 may enter onto the incident point IP with an inclined angle with respect to the normal direction.

The light incident film CHOE converts the incident light 100 into a propagating light 200 having an incident angle and refracts the propagating light 200 to the cover plate CP. Here, the incident angle may be larger than the internal total reflection critical angle of the cover plate CP. For example, the incident angle θ of the incident light 100 has the angle satisfying a total reflection condition between the upper surface of the cover plate CP and the low refractive layer LR. As a result, as repeating the total reflection, the propagating light 200 is propagating inside the cover plate CP without losing the amount of light along the X-axis, which is the length direction of the cover plate CP.

The light radiating film VHOE converts the propagating light 200 into the radiating light 300 and refracts the radiating light 300 to the upper surface of the cover plate CP. More specifically, the light radiating film VHOE generates the radiating light 300 going to the upper surface of the cover plate CP, by refracting the propagating light 200 to the vertical direction under the total reflection condition.

When no object is placed on the cover plate CP, the radiating light 300 goes out of the upper surface of the cover plate CP. That is, when no object is contacted on the sensing area SA, all radiating light 300 may go out from the cover plate CP, the image detection is not conducted.

As observing the propagating light 200 on the XZ plane (or, 'vertical plane') having the length axis and the thickness axis, the collimated condition of the incident light 100 is maintained. On the contrary, on the XY plane (or, 'horizontal plane') having the length axis and the width axis, the propagating light 200 is an diverged (or, expanded) light having an expanding angle, φ. This is to set the image sensing area of the expanded propagating light 200 to cover most area of the cover plate CP. For example, the light radiating film VHOE may have an area corresponding to the entire area of the light going-out part LOT. Further, the expanding angle φ is the inside angle between two lines, where one line is connecting the incident point IP and one end point of the opposite side of the cover plate CP and the other line is connecting the incident point IP and other end point of the opposite side of the cover plate CP.

Otherwise, the expanding angle φ may be set to expand over the entire sensing area SA. For example, as shown in FIG. 1, the sensing area SA may be set at the middle portion of the cover plate CP to have a rectangular shape or a trapezoid shape. In this case, the expanding angle φ can be set as the internal angle between two lines those straightly connecting from the incident point IP to two outermost points of the sensing area SA.

The area where the light incident film CHOE is disposed may be defined as a light entering part LIN. The area where the light radiating film VHOE is disposed may be defined as a light going-out part LOT. The space between the light entering part LIN and the light going-out part LOT is the light guiding area where the light is propagating. FIG. 1 shows that the light incident film CHOE covers the entire area of the light entering part LIN. However, the light incident film CHOE can have a size slightly larger than the size of the light incident point IP.

For example, the cross-sectional size of the collimated light generated from the light source LS may have the right circle shape of which radius is about 0.5 mm. The light incident film CHOE would have the length corresponding to the width of the cover plate CP and the width of 3 mm~5 mm. The light incident film CHOE may be disposed to cross the width of the cover plate CP or face the light source LS with having a shorter length than the width of the cover plate CP.

Further, the light sensor SE may be disposed at the same location as the light source LS. The light sensor SE is to detect the sensing light reflected by the object among the radiating light 300. The reflected light by the object among the radiating light 300, defined as the reflecting light 400, goes back to the light radiating film VHOE. Here, the reflecting light 400 goes along the perpendicular direction to the surface of the light radiating film VHOE.

According to FIG. 1B, the radiating light 300 is illustrated as shown at the head direction of the arrow (a dot is pointed in a circle) which means the arrow flies to the +Z direction. The reflecting light 400 is illustrated as shown at the tail direction of the arrow (an X mark is in a circle) which means the arrow flies to the −Z direction.

After entering into the light radiating film VHOE, the reflecting light 400 is converted into a reverse propagating light 500 which has the same light-path as the propagating light 200, but the direction is reversed. The reversed propagating light 500 has the same incident angle θ of the propagating light 200, and goes to the light entering part LIN.

The reverse propagating light 500 enters into the light incident film CHOE. By the light incident film CHOE, the reverse propagating light 500 is converted into the sensing light 600. The sensing light 600 has the same light-path with the incident light 100, but its direction is reversed from that of the incident light 100. After the sensing light 600 enters into the light sensor SE disposed at the same place of the light source LS or near the light source LS, the image of the object is reproduced.

Figure 2A:
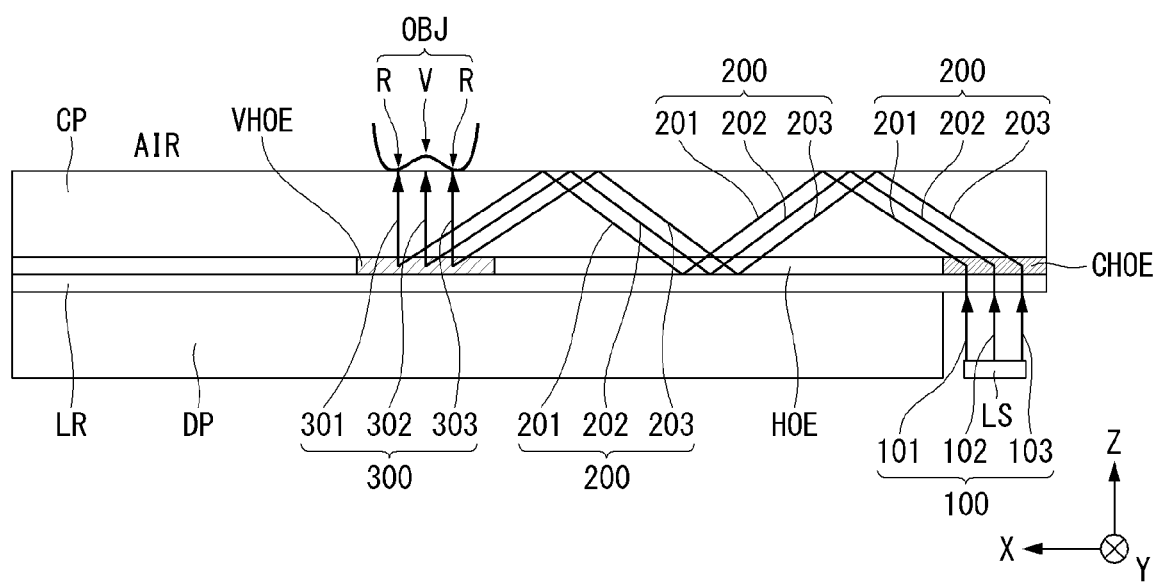
FIG. 2A is a cross-sectional view illustrating the light paths in which the light provided from a light source are converted into radiating light at a sensing area.
Figure 2B:
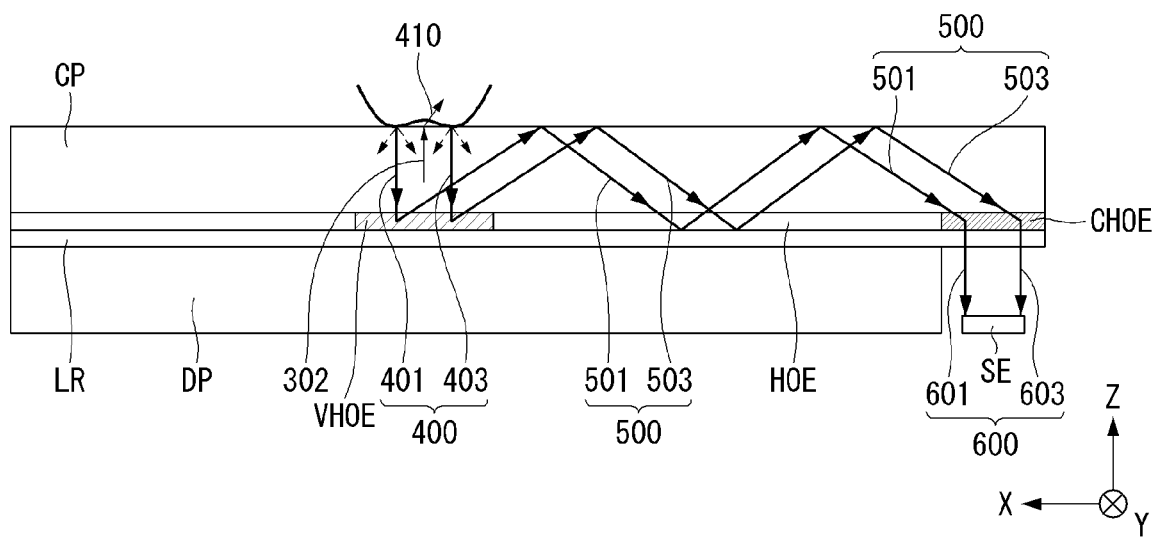
FIG. 2B is a cross-sectional view illustrating the light paths in which a light sensor receives sensing light reflected by an object located at the sensing area.

Hereinafter, FIGS. 2A and 2B illustrate how the image of the object is recognized by the flat panel display embedding the directional optical unit. FIG. 2A is a cross-sectional view illustrating the light paths in which the light provided from a light source are converted into the radiating light at the sensing area. FIG. 2B is a cross-sectional view illustrating the light paths in which the light sensor receives the sensing light reflected by the object located at the sensing area.

A flat panel display embedding a directional optical unit according to the present disclosure comprises a display panel DP, a directional optical substrate SLS, a light source LS and a light sensor SE.

The incident light 100 provided from the light source LS enters into the normal direction with respect to the surface of the incident point IP of the light incident film CHOE. Here, the light source LS may provide one beam of the collimated incident light 100 or a plurality of the incident light beams covering areas of the light incident film CHOE. For example, the incident light 100 may include a first incident light 101, a second incident light 102 and a third incident light 103.

The light incident film CHOE converts the incident light 101, 102 and 103 into a first propagating light 201, a second propagating light 202 and a third propagating light 203 refracted to have an incident angle θ to the normal direction with respect to the surface of the incident point IP. And then, the light incident film CHOE provides the propagating light 201, 202 and 203 to the inside space (or 'the media') of the cover plate CP.

The incident angle θ of the propagating light 201, 202 and 203 is larger than the total reflection critical angle THOE_LR at the interface between the base optical film HOE and the low refractive layer LR. The base optical film HOE is the part of the film disposed between the light incident film CHOE and the light radiating film VHOE. The light incident film CHOE and the light radiating film VHOE are the parts having a holographic pattern on the base optical film HOE. For example, when a refraction index of the cover plate CP and the base optical film HOE is 1.5, and a refraction index of the low refractive layer LR is 1.4, the total reflection critical angle THOE_LR at the interface between the base optical film HOE and the low refractive layer LR is greater than 69° (degree). Therefore, the incident angel θ is larger than 69°. For example, the incident angle θ may be between 70° and 75°.

As the upper surface of the cover plate CP is contacting to the air AIR, the propagating light 201, 202 and 203 are totally reflected at the upper surface of the cover plate CP. It is because that the total reflection critical angle TCP_AIR at the interface between the cover plate CP and the air AIR is about 41.4°. That is, when the incident angle θ is larger than the total reflection critical angle THOE_LR at the interface between the base optical film HOE and the low refractive layer LR, the incident angle θ is always larger than total reflection critical angle TCP_AIR at the interface between the cover plate CP and the air AIR.

Repeating the total reflection, the propagating light 201, 202 and 203 propagate from the light incident film CHOE to the light radiating film VHOE. By the light radiating film VHOE, the propagating light 201, 202 and 203 are converted into a first radiating light 301, a second radiating light 302 and a third radiating light 303, respectively. The light radiating film VHOE includes a holographic element configured to refract the propagating light 201, 202 and 203 having the incident angle of θ to the normal direction. The light radiating film VHOE is disposed under the sensing area SA.

When an image object OBJ such as a finger is contacted on the sensing area SA, the radiating light 301, 302 and 303 are radiated to the image object OBJ. For example, when the image object OBJ is the finger print, the image object OBJ includes a ridge R and a valley V. The ridge R is directly contacted on the upper surface of the cover plate CP, but the valley V is not contacted on the upper surface of the cover plate CP.

The radiating light 301 and 303 contacting the ridge R are reflected by the ridge R so that the reflecting light 401 and 403 enter back to the cover plate CP. On the contrary, the radiating light 302 to the valley V is refracted and then goes out from the cover plate CP. The refracted light at the valley V can be an extinction light 410. Very small amount of the second reflecting light 402 may be reflected at the valley V, but it may be negligible because it is much smaller than the reflecting light 401 and 403.

The reflecting light 401 and 403 reenter into the cover plate CP along to the normal direction to the surface of the cover plate CP and the surface of the light radiating film VHOE. The reflecting light 401 and 403 reentering into the light radiating film VHOE are converted into a reverse propagating light 501 and 503 which have the same light-paths with the propagating light 201 and 203 but their directions are reversed. The reverse propagating light 501 and 503 go to the light entering part LIN having the light incident film CHOE.

The reverse propagating light 501 and 503 reentering into the light incident film CHOE are converted into a first sensing light 601 and a third sensing light 603 which have the same light-paths with the incident light 101 and 103, respectively, but their directions are reversed. The sensing light 601 and 603 enter into the light sensor SE. After receiving the sensing light 601 and 603, the image of the object OBJ would be reproduced.

Figure 3:
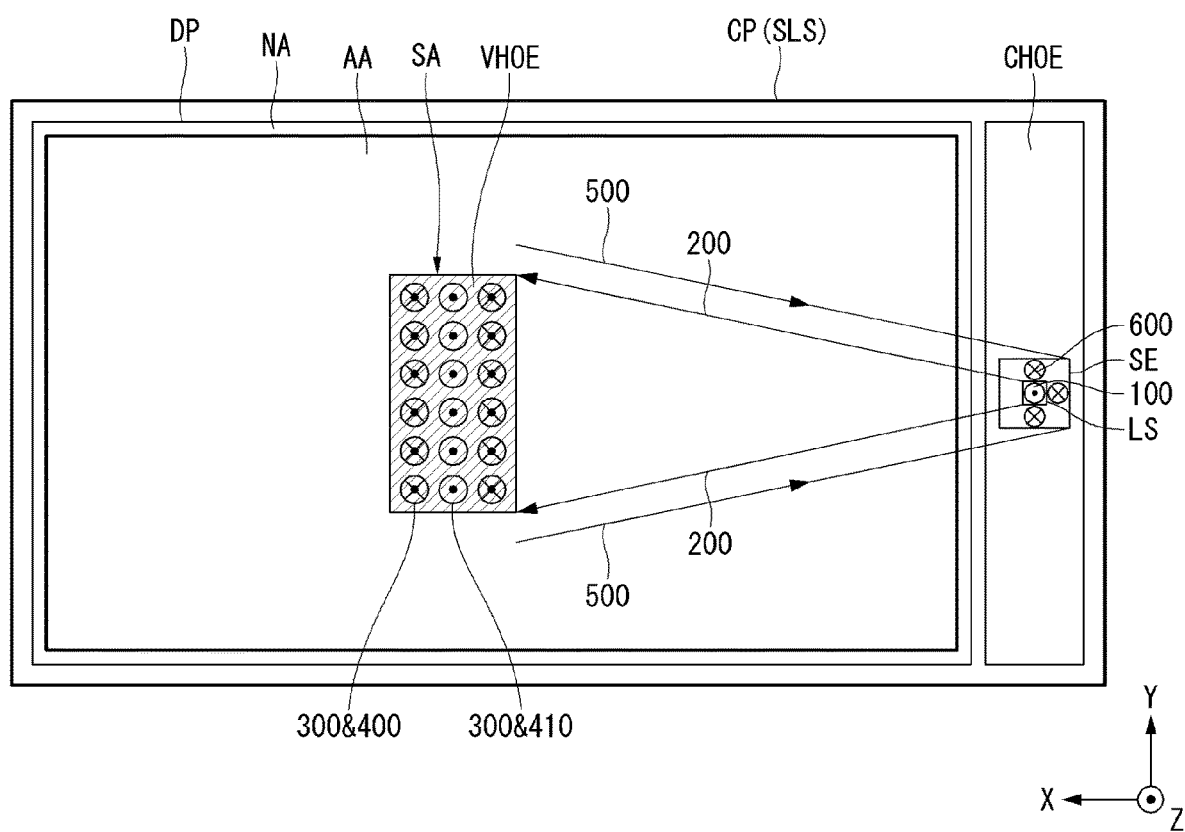
FIG. 3 is a plan view illustrating a structure of a flat panel display embedding an optical image sensor including a directional optical unit, according to an aspect of the present disclosure.

FIG. 3 is in reference to the plan structure of the flat panel display embedding an optical image sensor having a directional optical unit according to the first aspect of the present disclosure. More specifically, FIG. 3 is a plan view illustrating a structure of a flat panel display embedding an optical image sensor including a directional optical unit, according to the first aspect of the present disclosure.

Referring to FIG. 3, a flat panel display embedding an optical image sensor according to the first aspect of the present disclosure comprises a display panel DP, a directional optical substrate SLS and a light source LS. The display panel DP includes a display area AA and a non-display area NA. The display area AA may be disposed at the middle portions of the display panel DP. The non-display area NA may be surrounding the display area AA. The display area AA may have a plurality of the pixel areas in a matrix manner for representing the video images shown on the display panel DP. The non-display area may have a plurality of the driving elements for operating the display elements arrayed in the display area AA.

The directional optical substrate SLS may be a thin plate having a predetermined length, width and thickness. The length and width of the directional optical substrate SLS may have an enough size corresponding to the size of the display panel DP. For example, the directional optical substrate SLS may have the same size with the display panel DP, or the size slightly larger or smaller than that of the display panel DP. When the cover plate CP of the directional optical substrate SLS is used for the cover plate of the display panel DP, the directional optical substrate SLS may have a slightly larger size than that of the display panel DP.

In order to distinguish the display panel DP from the directional optical substrate SLS, FIG. 3 illustrates that the directional optical substrate SLS has larger size that of the display panel DP. In FIG. 3 the outer area except for the display area AA may be defined as the non-display area NA. The display area AA is the area displaying video image and conducting the image sensing operation. Further, the non-display area NA includes the light incident film CHOE, the light source LS and the light sensor SE.

The directional optical substrate SLS may be joined with the display panel DP as it is attached on the upper surface of the display panel DP. The directional optical substrate SLS includes a cover plate CP, a light incident film CHOE, a light radiating film VHOE and a low reflective layer LR, as mentioned above. The low refractive layer LR may be attached to the upper surface of the display panel DP and face each other. Here, the upper surface of the display panel DP is the front face providing the video images from the display panel DP. That is, the user observes the video image as seeing the upper surface of the display panel DP.

The light source LS is located at outside of any one side of the display panel DP. The light incident film CHOE is located at outside of the side of the display panel DP having the light source LS. The light incident film CHOE converts the incident light 100 provided from the light source LS into the propagating light 200.

As mentioned above, the radiating light 300 is provided to the upper surface of the cover plate CP, in detail to the sensing area SA defined at the cover plate CP of the directional optical substrate SLS. Some of the radiating light 300 may be the extinction light 410 going out from the cover plate CP, and others of the radiating light 300 may be the reflecting light 400 reentering into the light radiating film VHOE.

In FIG. 3, the incident light 100 and the radiating light 300 are illustrated as shown at the head direction of the arrow (a dot is pointed in a circle) which means the arrow flies to the +Z direction. The reflecting light 400 and the sensing light 600 are illustrated as shown at the tail direction of the arrow (an X mark is in a circle) which means the arrow flies to the −Z direction. Further, the symbol having a dot and an X mark simultaneously means that the radiating light 300 is converted into the reflecting light 400. As the extinction light 410 goes out to the same direction with the radiating light 300, the extinction light 410 is drawn with the same symbol of the radiating light 300.

The reflecting light 400 is converted into the reverse propagating light 500 reentering into the light incident film CHOE. By the light incident film CHOE, the reverse propagating light 500 is converted into the sensing light 600 entering into the light sensor SE. After the sensing light 600 enters into the light sensor SE, the image of the object is reproduced.

In the first aspect, the light source LS and the light sensor SE are located at the same place. The light source LS provides the incident light 100 as a point light. However, as the point light is converted into the propagating light 200 and then the radiating light 300, the point light may be changed into a surface light corresponding to the sensing area. The surface light is changed into the reflecting light 400 and then the reverse propagating light 500. The light returning back to the light entering part LIN is the surface light not the point light. Therefore, a plurality of light sensors SE may be arrayed to surround the light source LS.

Figure 4:
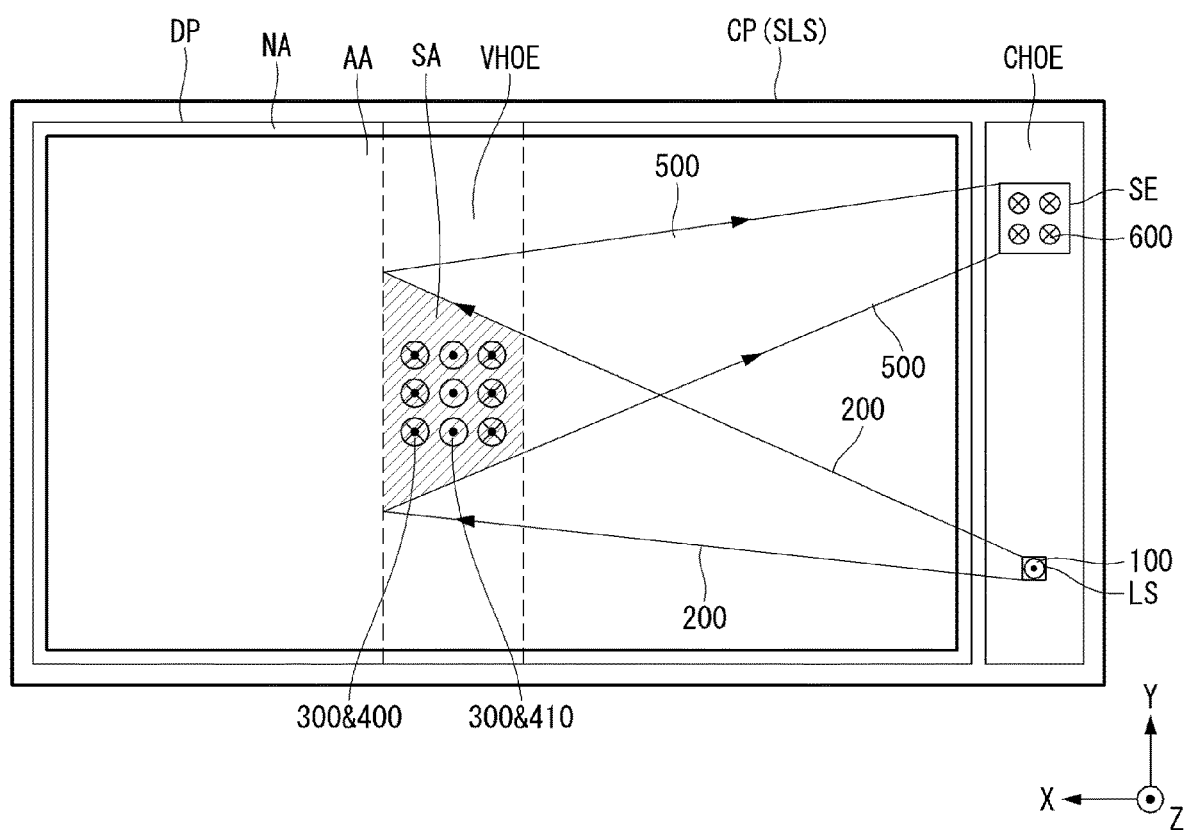
FIG. 4 is a plan view illustrating a structure of a flat panel display embedding an optical image sensor including a directional optical unit, according to another aspect of the present disclosure.

Hereinafter, FIG. 4 is in reference to the second aspect of the present disclosure. More specifically, FIG. 4 is a plan view illustrating a structure of a flat panel display embedding an optical image sensor including a directional optical unit, according to a second aspect of the present disclosure.

In the second aspect of the present disclosure, the light source LS and the light sensor SE are located at the different places. Specifically, the light source LS may be located at one end portion of a side of the display panel DP, and the light sensor SE may be located at another end portion of the side of the display panel DP having the light source LS.

The flat panel display embedding the optical image sensor of the second aspect is similar to the first aspect. The different point is on the locations of the light source and the light sensor. In the first aspect these locations are the same, but in the second aspect these locations are different.

Referring to FIG. 4, a flat panel display embedding an optical image sensor according to the second aspect of the present disclosure comprises a display panel DP, a directional optical substrate SLS and a light source LS. The display panel DP includes a display area AA and a non-display area NA. The display area AA may be disposed at the middle portions of the display panel DP. The non-display area NA may be surrounding the display area AA. The display area AA may have a plurality of the pixel areas in a matrix manner for representing the video images shown on the display panel DP. The non-display area may have a plurality of the driving elements for operating the display elements arrayed in the display area AA.

The directional optical substrate SLS may be a thin plate having a predetermined length, width and thickness. The length and width of the directional optical substrate SLS may have an enough size corresponding to the size of the display panel DP. For example, when the cover plate CP of the directional optical substrate SLS is used for the cover plate of the display panel DP, the directional optical substrate SLS may have a slightly larger size that of the display panel DP.

The directional optical substrate SLS may be joined with the display panel DP as it is attached to the upper surface of the display panel DP. The directional optical substrate SLS includes a cover plate CP, a light incident film CHOE, a light radiating film VHOE and a low reflective layer LR, as mentioned above. The low refractive layer LR may be attached to the upper surface of the display panel DP and face each other. Here, the upper surface of the display panel DP is the front face providing the video images from the display panel DP. That is, the user observes the video image as seeing the upper surface of the display panel DP.

The light incident film CHOE is located at outside the side of the display panel DP. For example, the light incident film CHOE may have a strip shape having length corresponding to the width of the display panel DP. The light source LS is disposed to face the light incident film CHOE. Specifically, the light source LS may be disposed to face one end portion of the light incident film CHOE. The light sensor SE is disposed to face the light incident film CHOE. Specifically, the light sensor SE may be disposed to face another end portion of the light incident film CHOE. The light source LS and the light sensor SE are disposed to be spaced apart from each other under the light incident film CHOE.

The incident light 100 provided from the light source LS is converted into the propagating light 200 by the light incident film CHOE. The propagating light 200 goes to the sensing area SA defined at the cover plated CP of the directional optical substrate SLS. The light radiating film VHOE is disposed under the sensing area SA. The propagating light 200 are converted into the radiating light 300 by the light radiating film VHOE. The radiating light 300 are provided to the upper surface of the cover plate CP. Some amounts of the radiating light 300 are reflected by the object OBJ contacting on the cover plate CP to the reflecting light 400. The reflecting light 400 go back to the light radiating film VHOE. Others of the radiating light 300 which does not hit the object OBJ go out of the cover plate CP as the extinction light 410.

In FIG. 4, the incident light 100 and the radiating light 300 are illustrated as shown at the head direction of the arrow (a dot is pointed in a circle) which means the arrow flies to the +Z direction. The reflecting light 400 and the sensing light 600 are illustrated as shown at the tail direction of the arrow (an X mark is in a circle) which means the arrow flies to the −Z direction. Further, the symbol having a dot and an X mark simultaneously means that the radiating light 300 may be converted into the reflecting light 400. As the extinction light 410 goes out to the same direction with the radiating light 300, the extinction light 410 is drawn with the same symbol of the radiating light 300.

The reflecting light 400 is converted into the reverse propagating light 500 and goes to the light sensor SE. The reverse propagating light 500 enters into the light incident film CHOE over the light sensor SE. By the light incident film CHOE, the reverse propagating light 500 is converted into the sensing light 600 entering into the light sensor SE. After the sensing light 600 enters into the light sensor SE, the image of the object would be reproduced.

In the second aspect, the light source SL and the light sensor SE are disposed to be spaced apart from each other. The light source LS provides the point light. However, as the point light is converted into the propagating light 200 and then the radiating light 300, the point light is changed into a surface light corresponding to the sensing area. The surface light is changed into the reflecting light 400 and then the reverse propagating light 500. The light returns to the light entering part LIN is the surface light not the point light. Therefore, the light sensors SE may be disposed to have a larger area than the light source LS.

The light radiating film VHOE includes a holographic optical element to convert (or reflect) the propagating light 200 into the reverse propagating light 500. Therefore, as shown in FIG. 4, reverse propagating light 500 has a light path as the propagating light 200 is reflected by the light radiating film VHOE. Therefore, the light source SL and the light sensor SE may be disposed at the symmetrical positions with respect to the light radiating film VHOE.

While the aspect of the present disclosure has been described in detail with reference to the drawings, it will be understood by those skilled in the art that the disclosure can be implemented in other specific forms without changing the technical spirit or essential features of the disclosure. Therefore, it should be noted that the forgoing aspects are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

What is claimed is:

1. A flat panel type optical image sensor comprising:
 a cover plate having a sensing area;
 a light incident film attached to a side of the cover plate;
 a light radiating film attached to the side of the cover plate corresponding to the sensing area;

a low refractive layer coupled to the light incident film and the light radiating film;
a light source facing the light incident film; and
a light sensor facing the light incident film.

2. The device according to claim 1, wherein the light source and the light sensor faces the light incident film and are disposed in close proximity to a center portion of the side of the cover plate.

3. The device according to claim 1, wherein the light source is disposed at a first end portion of the side and faces the light incident film; and
wherein the light sensor is disposed at a second end portion of the side and faces the light incident film, the second end portion spaced apart from the first end portion.

4. The device according to claim 1, wherein the light source provides an incident light in a perpendicular direction with respect to a surface of the light incident film;
wherein the light incident film converts the incident light into a propagating light having an incident angle satisfying an internal total reflection condition in the cover plate, and directs the propagating light into the cover plate; and
wherein the light radiating film converts the propagating light into a radiating light having a perpendicular direction with respect to a surface of the cover plate.

5. The device according to claim 4, wherein the sensing area provides a reflecting light reflected by an object contacting on the cover plate to the light radiating film in the perpendicular direction with respect to the surface of the cover plate.

6. The device according to claim 4, wherein the light radiating film converts a reverse propagating light having the incident angle, and provides the reverse propagating light to the light incident film.

7. The device according to claim 4, wherein the light incident film coverts the reverse propagating light into a sensing light provided to the light sensor in the perpendicular direction with respect to the surface of the light incident film.

8. The device according to claim 4, wherein the incident angle is larger than an internal total reflection critical angle within a space between an upper surface of the cover plate and an upper surface of the low refractive layer.

9. A flat panel display embedding an image sensor comprising:
a cover plate having a sensing area;
a light incident film attached to a surface of the cover plate;
a light radiating film attached to the surface of the cover plate corresponding to the sensing area;
a low refractive layer coupled to the light incident film and the light radiating film;
a light source facing the light incident film;
a light sensor facing the light incident film; and
a display panel attached to the low refractive layer and having a display area and a non-display area.

10. The device according to claim 9, wherein the light source and the light sensor are disposed to face the light incident film and in a close proximity to a center portion of the surface of the cover plate.

11. The device according to claim 9, wherein the light source is disposed at a first end portion of the surface of the cover plate and faces the light incident film,
wherein the light sensor is disposed at a second end portion of the surface of the cover plate and faces the light incident film, the second end portion spaced apart from the first end portion.

12. The device according to claim 9, wherein the light source provides an incident light in a perpendicular direction with respect to a surface of the light incident film.

13. The device according to claim 9, wherein the light incident film converts the incident light into a propagating light having an incident angle satisfying an internal total reflection condition in the cover plate, and provides the propagating light into the cover plate.

14. The device according to claim 9, wherein the radiating film converts the propagating light into a radiating light provided in perpendicular direction with respect to the surface of the cover plate.

15. The device according to the claim 14, wherein the sensing area provides a reflecting light reflected by an object contacting on the cover plate to the light radiating film in the perpendicular direction with respect to the surface of the cover plate.

16. The device according to the claim 14, wherein the light radiating film converts a reverse propagating light having the incident angle, and provides the reverse propagating light to the light incident film.

17. The device according to the claim 14, wherein the light incident film coverts the reverse propagating light into a sensing light provided to the light sensor in the perpendicular direction with respect to a surface of the light incident film.

18. The device according to the claim 14, wherein the incident angle is larger than an internal total reflection critical angle within a space between an upper surface of the cover plate and an upper surface of the low refractive layer.

19. A portable electronic device including a display panel with an embedded image sensor comprises:
a display area displaying an image on the display panel;
a cover plate having a sensing area and receiving the incident light;
a light source providing the cover plate with the incident light through the low refractive layer;
a light incident film receiving the incident light and expanding the received incident light corresponding to an area for the cover plate;
a light radiating film directing the expanded incident light to an object to detect an image of the object and corresponding to the sensing area of the cover plate;
a low refractive layer coupled to the light incident film and the light radiating film; and
a light sensor receiving the image detected light traveling through the cover plate and the low refractive layer, and the light sensor facing the light incident film, and
wherein the expanded incident light propagates with repeating an internal total reflection in the cover plate without substantially losing an amount of the incident light.

20. The device according to claim 19, wherein the light source and the light sensor face the light incident film and in a close proximity to a center portion of the cover plate.

21. The device according to claim 19, wherein the light source is disposed at a first end portion of the cover plate, the light sensor is disposed at a second end portion of the cover plate, and the first and second end portions spaced apart from each other.

22. The device according to claim 19, wherein the light source provides the incident light in a perpendicular direction with respect to a surface of the light incident film.

23. The device according to claim 19, wherein the light radiating film converts the propagating light into a radiating light provided in perpendicular direction with respect to the cover plate.

24. The device according to the claim 23, wherein the sensing area provides a reflecting light reflected by the object contacting the cover plate to the light radiating film in the perpendicular direction with respect to the cover plate.

25. The device according to the claim 23, wherein the light radiating film converts a reverse propagating light having an incident angle, and provides the reverse propagating light to the light incident film.

26. The device according to the claim 25, wherein the light incident film coverts the reverse propagating light into a sensing light provided to the light sensor in the perpendicular direction with respect to a surface of the light incident film.

27. The device according to the claim 25, wherein the incident angle is larger than an internal total reflection critical angle within a space between an upper surface of the cover plate and an upper surface of the low refractive layer.

* * * * *